(12) United States Patent
Nguyen et al.

(10) Patent No.: US 6,449,170 B1
(45) Date of Patent: Sep. 10, 2002

(54) INTEGRATED CIRCUIT PACKAGE INCORPORATING CAMOUFLAGED PROGRAMMABLE ELEMENTS

(75) Inventors: Quang D. Nguyen, Milpitas; Charles Anderson, Los Altos, both of CA (US); James J. Casto, Austin, TX (US); Alexander C. Tain, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 29 days.

(21) Appl. No.: 09/651,893

(22) Filed: Aug. 30, 2000

(51) Int. Cl.$^7$ .................................................. H05K 7/06
(52) U.S. Cl. ........................ 361/778; 361/767; 361/783; 257/209; 257/529; 257/700; 257/922; 257/530; 438/132; 438/131
(58) Field of Search ................................ 361/760, 767, 361/768, 771, 777, 783, 778, 805; 257/209, 529, 530, 922, 700–703, 723, 724; 438/467, 600, 601, 131, 132; 324/765

(56) References Cited

U.S. PATENT DOCUMENTS

| | | | | |
|---|---|---|---|---|
| 4,706,165 A | * | 11/1987 | Takenaka et al. | 361/767 |
| 5,039,628 A | * | 8/1991 | Carey | 228/180.21 |
| 5,288,949 A | * | 2/1994 | Crafts | 361/778 |
| 5,953,216 A | * | 9/1999 | Farnworth et al. | 361/777 |
| 6,026,221 A | * | 2/2000 | Ellison et al. | 700/121 |
| 6,191,482 B1 | * | 2/2001 | Senba et al. | 257/529 |

\* cited by examiner

*Primary Examiner*—David L. Talbott
*Assistant Examiner*—John B. Vigushin
(74) *Attorney, Agent, or Firm*—McDermott, Will & Emery

(57) ABSTRACT

An integrated circuit package includes at least one one-time programmable element, such as a fuse, having a first end and a second end separated by a programmable link. The programmable element is positioned on a surface other than the top surface, e.g., a side surface or the bottom surface of the package substrate to render them less conspicuous to unscrupulous suppliers intent on tampering with the package. The information programmed by the fuses may relate to speed or voltage ratings for a microprocessor.

18 Claims, 8 Drawing Sheets

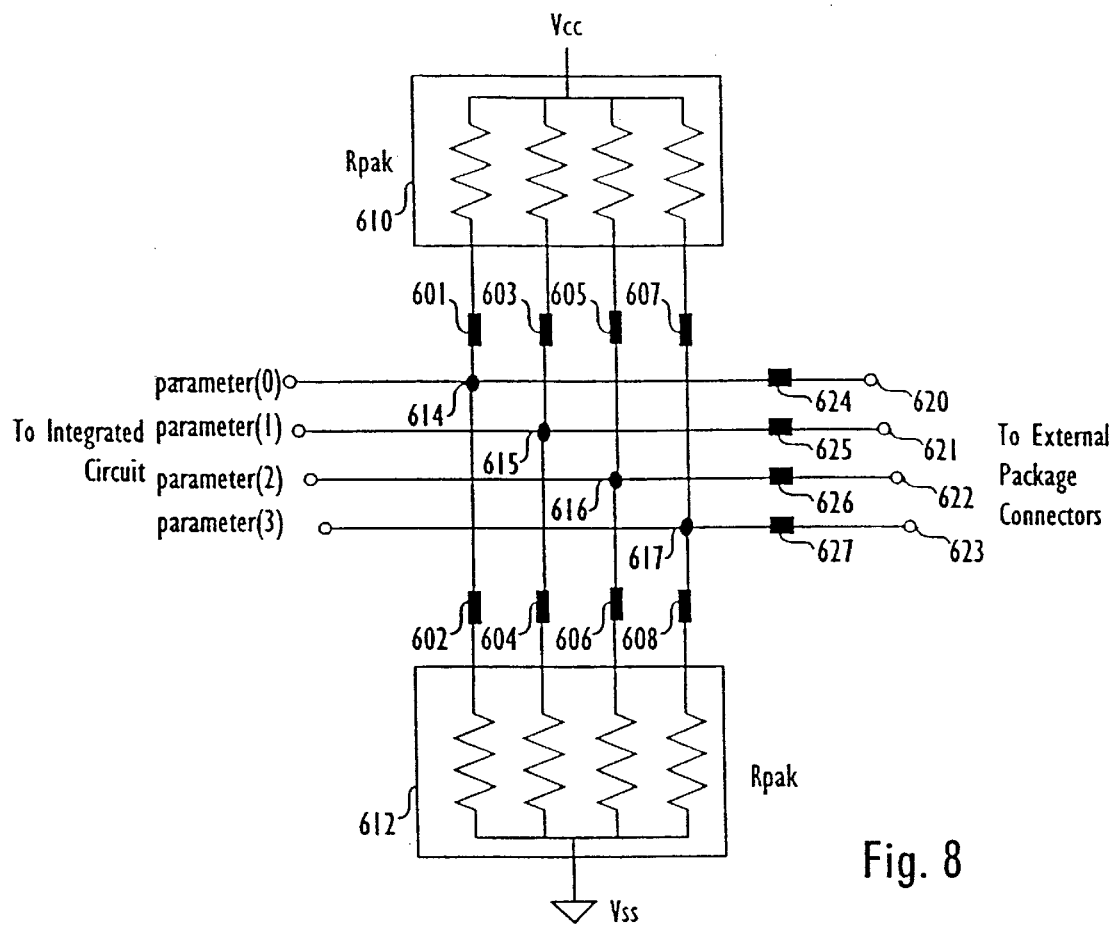
Fig. 8
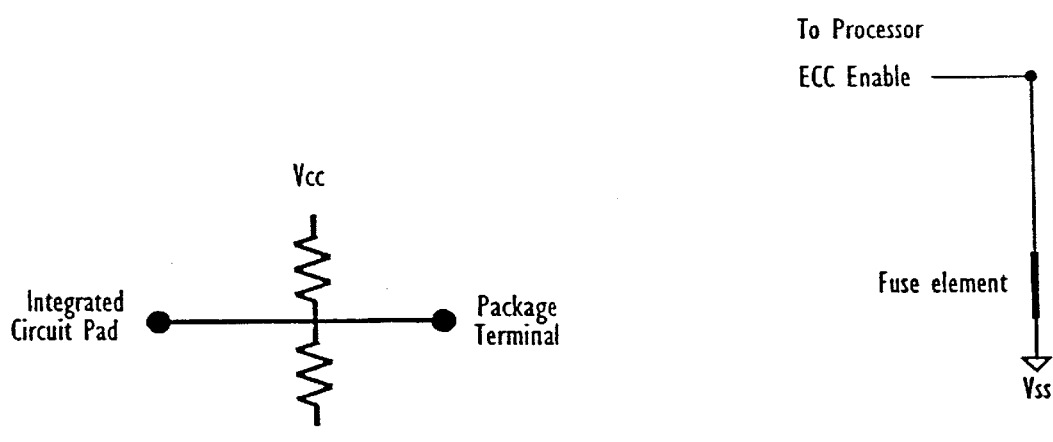
Fig. 9
Fig. 10

INTEGRATED CIRCUIT PACKAGE INCORPORATING CAMOUFLAGED PROGRAMMABLE ELEMENTS

FIELD OF THE INVENTION

The invention relates to integrated circuits, and more particularly, to the prevention of tampering with the operating parameters for integrated circuitry.

DESCRIPTION OF THE RELATED ART

Integrated circuits such as microprocessors can be run at different clock speeds and with different supply voltages. The determination of what is the appropriate clock speed and appropriate voltage depends on many factors. A higher clock speed requires a higher supply voltage. In addition, the higher clock speed results in additional heat and power being dissipated. Microprocessors utilized in mobile applications are particularly sensitive to power dissipation and generally require the lowest power dissipation and thus require the lowest supply voltage that can achieve the rated clock speed. Microprocessors used in desktop applications are less sensitive to power dissipation considerations.

In general, microprocessor product yield, performance (MHz) and reliability are affected by the voltage supply setting. Within a range of only several hundred millivolts, dramatic differences can be seen in yield, performance and reliability, even from the same wafer lot. Choosing the best voltage is usually a compromise of yield, performance and reliability since the same value of voltage is usually chosen for a large population.

A higher percentage of a given population of microprocessors could operate at higher performance levels (thus creating higher revenue) if each microprocessor could operate at its own specific voltage. One solution would be to mark each processor with a number or symbol indicating its voltage and/or speed rating. However, that provides no guarantee that the appropriate voltage is supplied to the microprocessor in the final system.

Referring to FIG. 1, one prior art approach for providing the appropriate voltage and frequency values in a computer system is illustrated. Central processing unit (CPU) 101 receives bus frequency signals 103 (BF[2:0]), which provide a multiplier used by the processor to multiply a bus clock (not shown). The multiplied bus clock is used by the CPU to clock its internal logic. CPU 101 also receives core voltage 105 (commonly referred to in x86 architectures as Vcc2) from CPU core voltage regulator 107. Other voltages, which are typically supplied to the CPU, e.g., Vcc3 (I/0 voltage) are not shown. Core voltage regulator 107 is programmable and receives voltage control inputs 109 (also referred to as voltage ID (VID) signals) which determine the voltage level supplied to CPU 101. The values for the both the VID signals and the BF pins are provided by the settings of jumpers 111.

It is important that a microprocessor is not run at clock speeds in excess of the speed determined by the manufacturer's testing procedure and guaranteed by the manufacturer. Operating he microprocessor above the manufacturer's specifications creates potential reliability issues that can cause the microprocessor and/or end user applications to malfunction and to fail.

It is conceivable to set the jumpers to correspond to the marking (number or symbol) on the processor that indicates its voltage and/or speed rating. However, that approach provides no guarantee that appropriate voltage and frequency settings will be utilized. In fact, certain unscrupulous suppliers of computer systems have been known to provide systems having higher than recommended voltages and frequencies. Since companies typically qualify and validate chips at certain voltage and frequencies, such over clocking or excessive voltage can result in shorter product lifetimes, decreased reliability and excessive product returns.

Further, systems with an overclocked microprocessor can be sold at a premium which is unjustified. Failure of such systems to operate properly at the mismarked speed cause end user dissatisfaction with the system. This end user dissatisfaction is usually directed at the manufacturer and results in damage to the manufacturer's reputation, goodwill, and can affect future sales. The sale of such overclocked systems can cost microprocessor chip manufacturers millions of dollars in lost sales (of properly marked higher speed microprocessors as well as future sales) and in repair and replacement costs. In addition, manufacturers have sometimes been put in the position of having to replace mismarked parts to protect their reputation.

Thus, it would be desirable to minimize the opportunity for deliberate overclocking or over voltage. Further, it would be desirable to obtain higher aggregate performance from a given population of microprocessors without unduly complicating the manufacturing process.

SUMMARY OF THE INVENTION

There is a need for a programmable semiconductor device package arrangement and method of programming the same in which the opportunity for deliberate overclocking or over voltage is minimized.

There is also a need for a programmable semiconductor device package arrangement and method of programming the same in which programming elements are positioned on a package substrate so as to obfuscate the programming elements from an unscrupulous supplier.

This and other needs are met by embodiments of the present invention which provide a package for mounting at least one integrated circuit die comprising a package substrate that includes a bottom surface having first connectors configured for electrically connecting the package to a circuit board. The top surface opposite the bottom surface of the package substrate has second connectors configured for electrically connecting a semiconductor device to the package. One-time programmable elements are provided on a surface other than the top surface and have a first and a second end separated by a programmable link. The first end of the one-time programmable element is coupled to a power supply voltage node in the package. These one-time programmable elements are programmable to adapt the package to different semiconductor devices having different operating parameters. Embodiments of the invention include providing the one-time programmable elements on a side surface or a bottom surface of the package.

By the provision of programmable elements on a side surface or a bottom surface of the package, rather than the top surface, the possibility that the programmable elements will be located and reworked is reduced. Shorter product lifetimes, decreased reliability, consumer dissatisfaction, and excessive product returns that otherwise may result are minimized.

The earlier-stated needs are also met by another embodiment of the present invention which provides a method of configuring a circuit board and package arrangement comprising the steps of electrically and mechanically connecting an integrated circuit to a top surface of a package board. The integrated circuit is configured to operate within specified operating parameters. Programmable elements positioned on at least one surface of the package board other than the top surface of the package board are programmed to adapt the package board to the specified operating parameters of the integrated circuit.

The foregoing and other features, aspects, and advantages of the present invention will become more apparent from the following detailed description of the present invention when taken in conjunction with the accompanying drawings.

BRIEF DRAWINGS OF THE DESCRIPTION

FIG. 8 shows an embodiment in which the various embodiments shown in FIGS. 6–7 are combined.

FIG. 9 shows a schematic of the fuses shown in FIGS. 6–7.

FIG. 10 shows another embodiment in which a fuse provides ECC information to a processor.

The use of the same reference symbols in different drawings indicates similar or identical items.

DETAILED DESCRIPTION OF THE INVENTION

The present invention addresses and solves problems related to deliberate over clocking by tampering with programmable elements particularly visible on the top surface of a package substrate. The present invention achieves this, in part, by positioning programmable elements on a surface other than the top surface of the package, e.g., a side surface or the bottom surface of the package board. Hence, the programmable elements are not as conspicuous and may even be camouflaged by miscellaneous metallization or connectors, e.g., a pin field. Even if recognized, reworking of programmable elements positioned in accordance with the invention requires use of expensive and complicated equipment.

Figure 1:
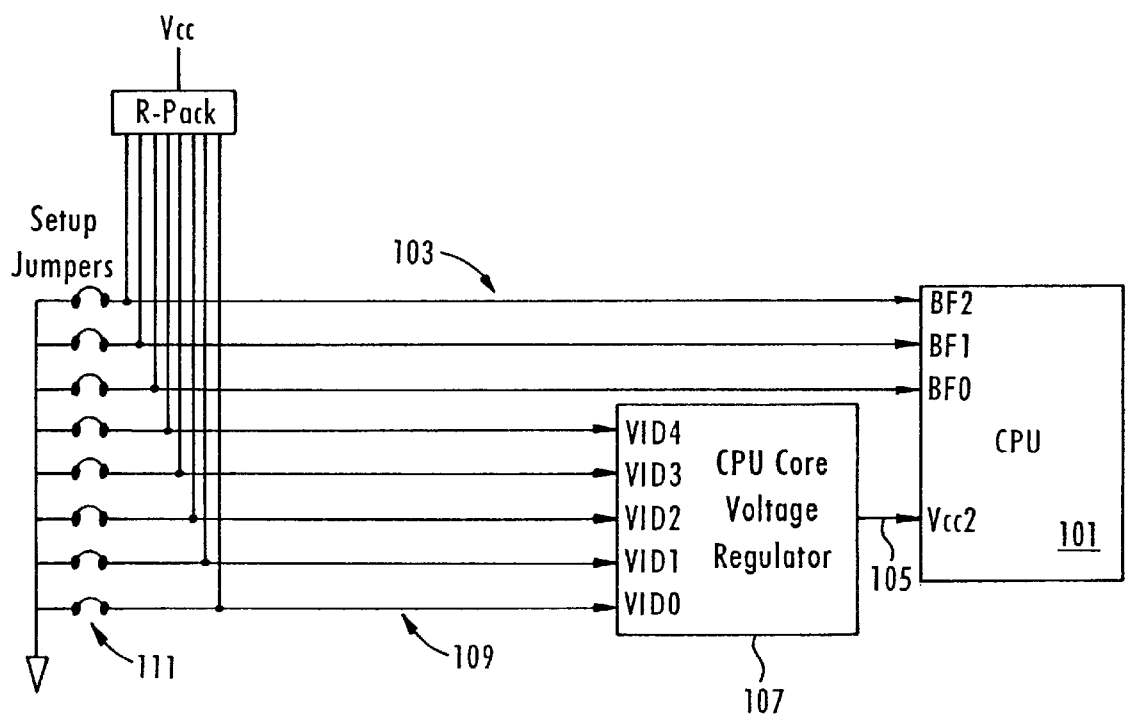
FIG. 1 shows a prior art approach to providing voltage and frequency settings.
Figure 2:
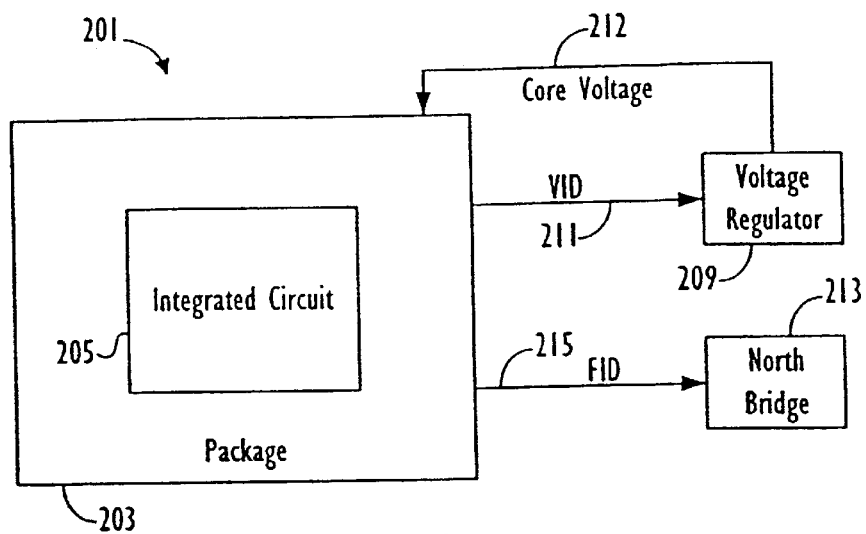
FIG. 2 illustrates a high level system view of one embodiment of the present invention.

Referring to FIG. 2, an overview of a system incorporating one embodiment of the present invention is illustrated. FIG. 2 shows microprocessor 201 which includes package 203 that holds integrated circuit die (also commonly referred to as a chip) 205. Package 203 includes fuses 207 (shown in FIGS. 2A–2B). Based on the programming of fuses 207, the package supplies voltage regulator 209 with VID signals 211. Based on the VID signals, voltage regulator 209 supplies core voltage 212 to processor 201. In addition, the package may supply system controller 213 (e.g. a north bridge including a memory controller and a PCI bridge) with frequency ID signals 215 which indicate the system clock multiplier at which the processor core operates. The fuses may also supply one or more parameters to chip 205.

Package 203 includes a number of external connections such as those providing VID signals 211. Note that the term package as used herein is intended to include any integrated circuit carrier. The exact nature of the external connection between the package and the card to which it attaches, e.g., a motherboard or daughter card, varies according to the type of package. For example, connection between the package and the board may be through package pins such as with Pin Grid Array (PGA) packages, or using other interconnection technologies such as tape automated bonding (TAB), chip scale package (CSP) technologies, or ball grid array (BGA) packages.

In addition to the external connections, the package 203 provides connections between chip 205 and package 203. The connection between chip 205 and package 203 varies according to the type of package. Typical package/chip interconnection technologies include wirebonding, flip chip connections and tape automated bonding (TAB). The connections between the package and the chip and the package and the board provide for signal input/output (I/0), which convey signal information to and from the integrated circuit chip. In addition to signal I/0, the package connections provide connections for Vss and Vcc.

A wide variety of package technologies exist that can exploit the present invention. The packages are typically multi-layered packages with vias providing interconnections between the various layers. For example, package 203 may be a multi-layer laminate made of FR4 or FR5 fiberglass, Bismaleimide Triazine (BT) Resin, or other types of organic laminate structures known in the art. The packages described herein are exemplary only and any ceramic or organic package or other package formed of other suitable material that can accommodate programmable interconnections such as fuses may used in practicing the invention.

Figure 2A:
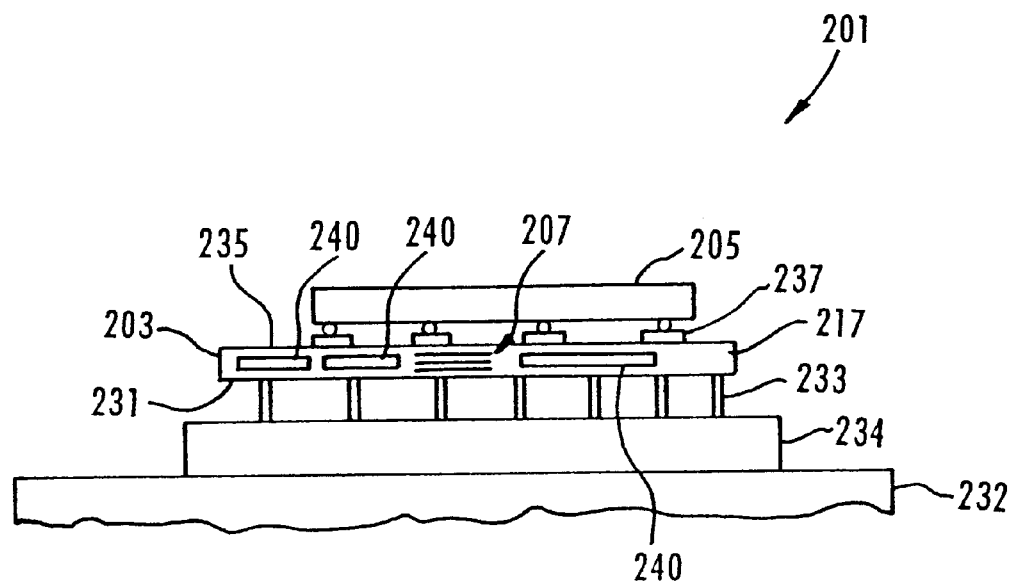
FIGS. 2A–2B illustrate fuse positioning in various embodiments of the present invention.
Figure 2B:
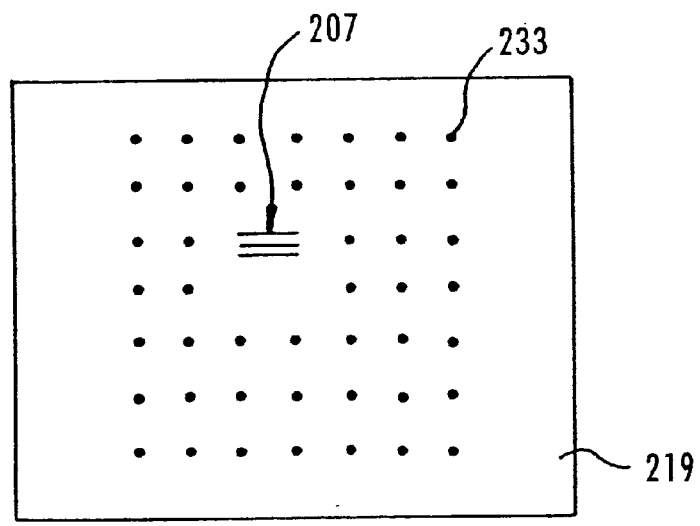

As shown in FIGS. 2A–2B, fuses 207 specifying operating parameters such as voltage and frequency may be formed on the side surface 217 of the package and/or the bottom surface 219 of the package. The fuses 207 may be formed by a metallization pattern on the package surface that connect through vias to other layers of the multi-layer package and subsequently to interconnections between the chip and package, external package connections, or both. The metallization patterns may be screen-printed metallization patterns.

A laser process (e.g., using a $CO_2$, UV or a diode pumped Nd:YAG laser) may be used to program the fuses by ablating away a portion of the metallization pattern once the appropriate setting(s) for the fuse or array of fuses are known. The amount of the fuse that is ablated away may vary. For instance, the programming of the fuse may only require a cut sufficient to provide an open circuit. Alternatively, substantially all of the conductive material residing on the surface of the package may be ablated away to minimize the risk of accidental (or intentional) shorting of the fuse afterwards. By programming an array of fuses, the appropriate "data" for operating the processor (e.g., voltage or frequency control values) may be specified. The fuse area on the package can then be covered with a suitable insulating material such as epoxy or silicone to prevent later tampering or accidental damage.

FIGS. 2A–2B illustrate various positioning of the fuses in accordance with embodiments of the present invention.

Referring to the side view depicted in FIG. 2A, the microprocessor 201 includes a motherboard or other circuit board 232 that includes a socket 234. An integrated circuit package 203 is received in the socket 234. Package substrate 203 has a bottom surface 231 with a set of first connectors 233 that are configured for electrically and mechanically connecting the package 203 to the motherboard 232 through the socket (234). The first connectors 233 may be a set of pins, for example, that are received within recesses of the socket 234. This arrangement is exemplary only, however, as other types of connectors, such as soldered connections, may be employed.

The package substrate 203 has a top surface 235 with second connectors 237 configured for electrically connecting the semiconductor device 205 to the package substrate 203. In FIG. 2A, one or more fuses 207 are present on at least one side surface 217 of the package substrate 203. Placement of the fuses 207 on a side surface 217 advantageously obscures the fuses 207 from an unscrupulous supplier. In addition, the fuses 207 can be camouflaged on side surface 217 by embedding them among already existing miscellaneous metallization 240 making them even less conspicuous, thereby making the fuses more difficult to identify and to rework. Even when identified as fuses, the positioning of these fuses makes it more difficult to rework the settings, necessitating the use of sophisticated equipment.

With reference to the bottom view depicted in FIG. 2B, package substrate 203 has a bottom surface 231 with a set of first connectors 233 that are configured for electrically connecting the package 203 to the motherboard 232 through the socket 234. As shown, fuses 207 are embedded within the first set of connectors 233, i.e., within the pin field. The length of the pins and their close proximity makes the fuses less conspicuous, thereby making them difficult to identify and rework.

As indicated earlier, the fuses 207 can be provided on the side surfaces of the package 203, as depicted in FIG. 2A, or on the bottom of the package 203, as depicted in the embodiment of FIG. 2B. In other embodiments of the invention, the fuses are placed in both areas. All of the fuses could be active, or only certain ones of the fuses are made active, with the remaining fuses being "dummy" fuses that serve to make it more difficult to overclock the integrated circuitry.

Figure 3A:
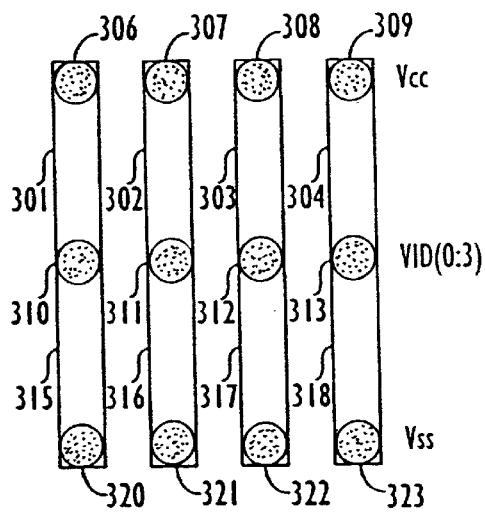
FIGS. 3A–3C illustrate various fuse configurations.
Figure 3B:
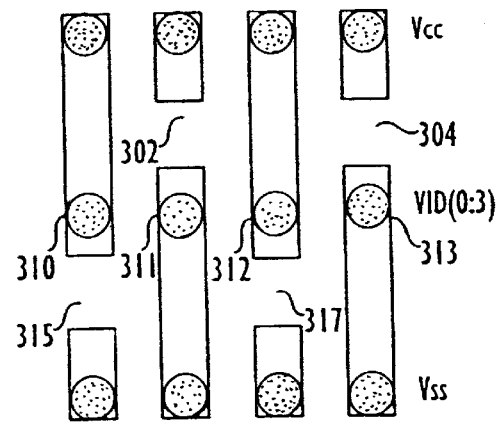
Figure 3C:
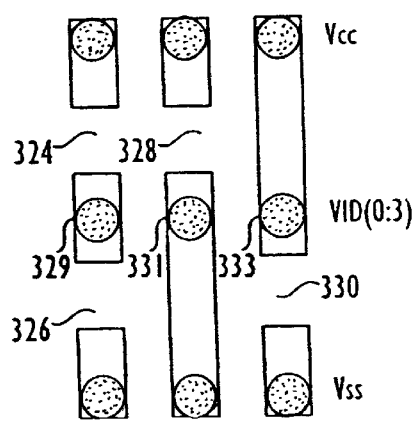

FIGS. 3A–3C illustrate various programming possibilities for exemplary fuses. The fuses are formed by metal traces, or other suitable conductors, which connect to vias, indicated by dark circles at each end of the fuse. The vias shown, in general connect to package pins (i.e. external package connections), package power supply nodes (Vss or Vcc) or internal package nodes that connect to the integrated circuit die when it is mounted on the package. The particular connection depends on the type of information intended to be specified by the fuses. FIG. 3A shows the fuses prior to programming.

The fuses shown in FIG. 3A determine four bits of information. Each bit requires at least one cut. As shown in FIG. 3A, the top row of fuses 301–304 couple through vias 306–309 to Vcc. The top row of fuses also connect to vias 310–313, which in turn are coupled to package pins to provide four voltage ID (VID) bits for connection to a voltage regulator. The bottom row of fuses 315–318 couple at one end through vias 320–323 to Vss. At the other end, the fuses couple to vias 310–313 and thus connect to one end to the top row of fuses 301–304.

Each of the fuses 301–304 and 315–318 include a fusible link coupling each end of the fuse formed by the metal trace or other suitable conductor. Referring to FIG. 3B, the programming shown provides a binary setting of 1-0-0-1 as the value of the fuses, where 1 is Vcc and 0 is Vss. That is, fuses 315 and 317 are blown causing vias 310 and 312 to be coupled only to Vcc. Fuses 302 and 304 are also blown causing vias 311 and 313 to be only coupled to Vss.

If the circuit that receives the value programmed by the fuses can differentiate an open circuit from both a high and low voltage, i.e., if the receiving circuit can utilize ternary logic, then additional voltage settings can be provided using fewer pins. For example, referring to FIG. 3C, three VID pins provide 27 separate options. FIG. 3C shows a fuse programming of 1-0-2 where 2 is Vcc, 1 is open and 0 is Vss. That is, the fuses are blown at 324 and 326 to provide a float at node 329. Additionally, the fuses are blown at 328 and 330 to provide a 0 and 2 respectively on nodes 331 and 333.

In addition to the four package pins required in FIGS. 3A and 3B and the three package pins required in FIG. 3C, an additional package pin may be required in order to provide a special Vcc pin for testing purposes. Otherwise, the package may have its Vcc and Vss planes shorted together during testing of the package and integrated circuit prior to programming of the fuses.

Note that the use of the term "package pin" is used herein for convenience in describing certain embodiments. While the term is used herein to sometimes describe pins of PGA packages, the term is also used generally herein and is intended to encompass any external connection or contact between the package and the board.

Rather than provide fuse pairs to determine each VID value as illustrated in FIGS. 3A–3C, alternatively a single fuse can be used to selectively couple a package pin to a power supply voltage. For example, referring to FIG. 4A, the values for VID are provided by fuses 401–404. Each bit requires at most one cut. Fuses 401–404 couple through vias 406–409 to external package connections and provide, e.g., four VID bits for connection to a voltage regulator. The fuses also connect to vias 410–413, which in turn are coupled to Vss.

Figure 4A:
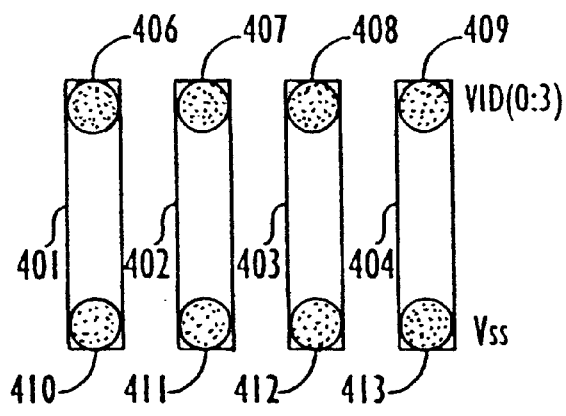
FIGS. 4A–4B show different views of another fuse configuration.
Figure 4B:
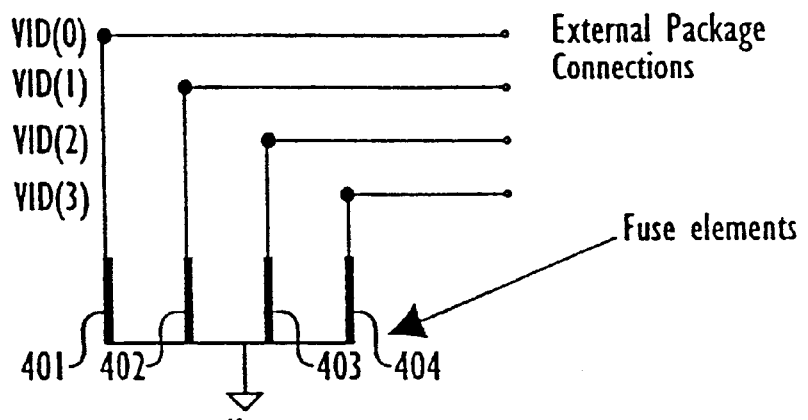
Figure 5:
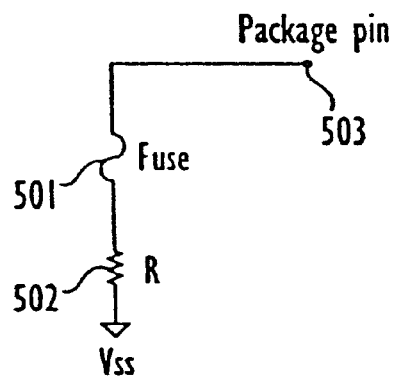
FIG. 5 shows a schematic of one of the fuses in FIGS. 4A or 4B.

If fuse 401 is blown, then the package pin is not connected to Vss. An external pull-up circuit is required to set the package pin to Vcc (unless the receiving circuit can distinguish an open from a ground). FIG. 4B shows another representation of the fuses shown in FIG. 4A. Each of the fuses shown in FIGS. 4A and 4B is represented by the circuit shown in FIG. 5, which shows fuse 501 coupled to Vss through a low resistance resistor 502 (0 ohms is acceptable) and to package pin 503. The configuration shown in FIG. 4 requires a maximum of only one cut per bit of information but does require external pull-up circuits. The minimum number of cuts for four bits of information is 0 while the maximum number of cuts is four. With the four fuses shown in FIGS. 3A or 4A, up to sixteen different voltage ID values may be specified. Cut here refers to blowing the fuse, typically using a laser, although other method are possible as described further herein.

While the power supply voltage on the package shown in the embodiment in FIGS. 4A and 4B is Vss, it is of course possible to instead provide a one-time programmable connection to Vcc on the package and have an external pull down circuit.

Other parameters may also be specified rather than voltage. For example, as described with relation to FIG. 2, frequency ID information may also be specified.

Figure 6:
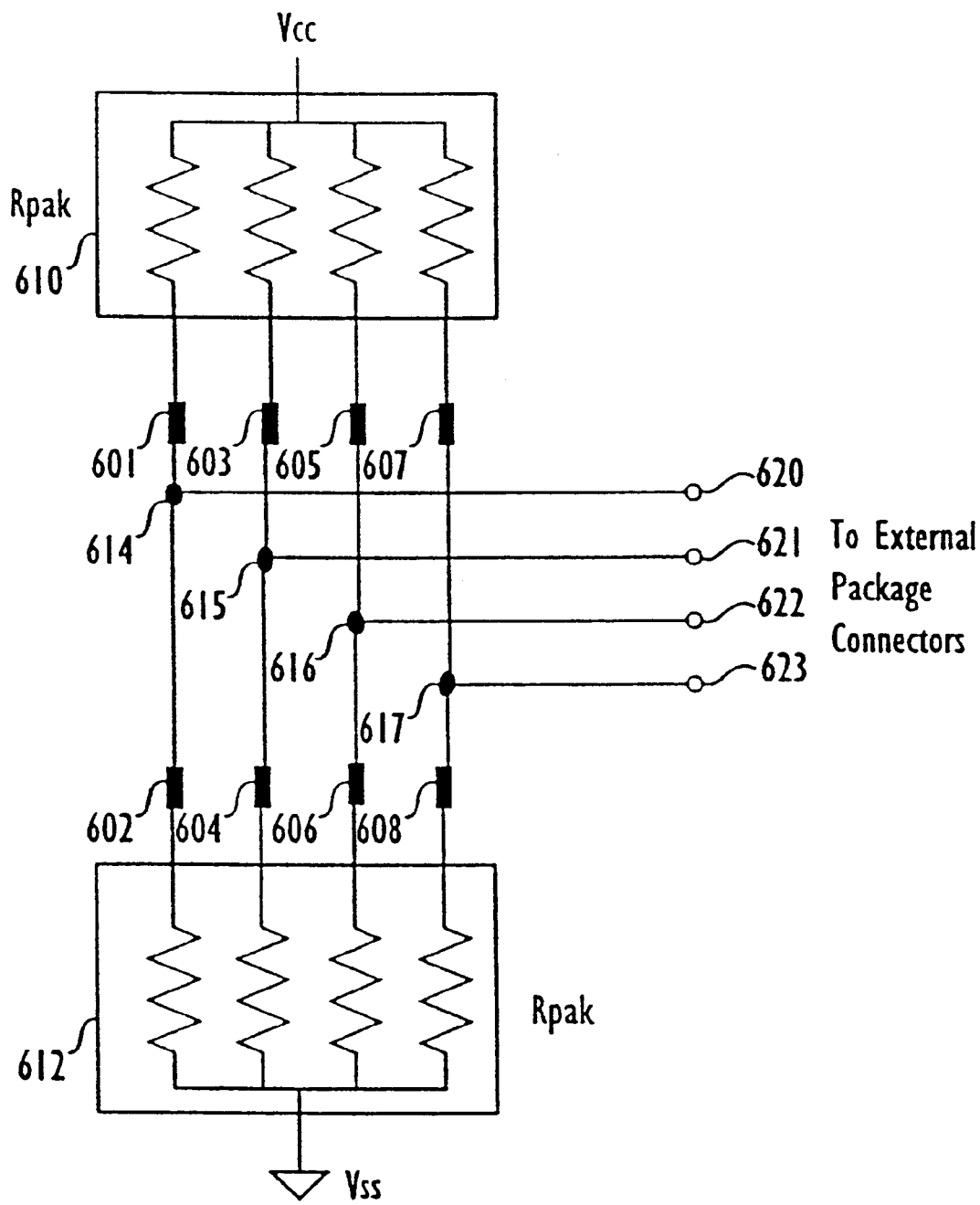
FIGS. 6 shows another fuse configuration for providing information to package terminals.

Referring to FIG. 6, another fuse configuration is illustrated which provides four bits of information. The fuses are again configured in pairs (e.g., fuses 601 and 602) in a manner similar to FIGS. 3A–3C. The top fuses 601, 603, 605 and 607 of each pair couple to Vcc through resistors in resistor pack 610. The bottom fuse of each fuse pair, fuses 602, 604, 606 and 608, couple to Vss through resistors in resistor pack 612. The resistors provide a voltage divider function and thus, an extra test pin (to avoid having Vss shorted to Vcc during testing prior to programming of the fuses) may not be necessary. In the embodiment shown in FIG. 6, each of the fuse pairs couple respectively to common nodes 614–617. The common nodes 614–617 couple to external package connections, e.g., package pins. In other embodiments, the common nodes may couple only to external package connections (package pins) or only to the chip and not utilize package pins.

Figure 7:
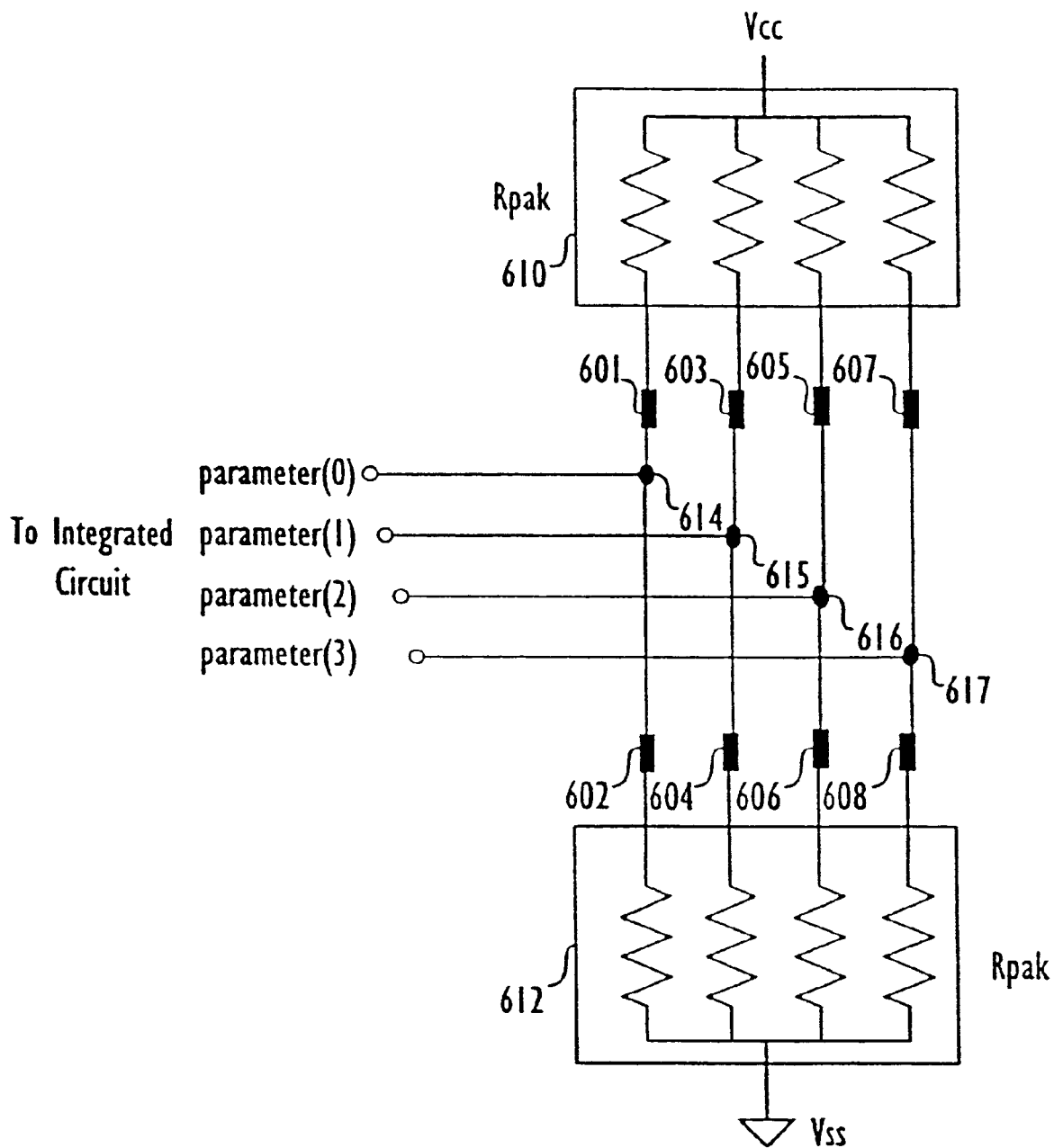
FIGS. 7 shows another fuse configuration for providing information to input terminals of the integrated circuit die.

FIG. 7 illustrates an embodiment in which the value specified by the fuse array is provided to the integrated circuit instead of going to the package pins. Internal nodes 614–617 couple to, e.g., C4 pads coupling the die to the package. The fuse array may be specifying a voltage, frequency or other parameter to the integrated circuit die.

FIG. 8 illustrates an embodiment combining the features of FIGS. 6 and 7, but also includes fuse elements 624–627 that are coupled serially between common nodes 614–617 and external package pins 620–623. The fuses 624–627 provide a connection between the chip and the package pins during testing, but are removed prior to product shipping. A schematic of one of the fuse pairs in FIG. 6–8 is shown in FIG. 9.

In order to program the fuse configuration shown in FIGS. 6–9, at least one fuse of each pair must be blown to connect the common node to either Vcc or Vss. Thus, for four bits of information, four cuts are generally required. If three state logic is available then both fuses of a pair can be cut to represent a third value.

Referring to FIG. 10 another embodiment illustrates a fuse, without the voltage divider configuration used in FIGS. 6–9, providing a parameter value to the integrated circuit die mounted on the package. In the particular embodiment, a signal is provided to that selectively enables error correcting code (ECC) according to the state of the fuse. The ECC signal may be used, e.g., for an on-board cache for a microprocessor. An internal pull-up is required in the processor to specify a value if the fuse is not cut.

The description so far has described cutting fuses with lasers. Several alternative embodiments are also possible. For instance, while the fuses have been described as being laser programmable, the fusible links may also be programmed electrically in a manner known in the art. That is the fuses may be fabricated as electrically programmable fuses. Further, while the fuses have been described as being on the surface of the package, the fuses may actually be fabricated on internal layers of a multi-layer package and be fabricated out of a conductive material other than metal. If fuses are on a layer other than the surface of the package, then electrically programmable fuses may be preferred.

Further, while the embodiments so far have been described using fuses to provide one-time programmable interconnections to supply voltages and to external and internal package connections, antifuses may also be used. A fuse provides a normally short circuit that turns into an open circuit when fused, using either electrical or laser programming. An antifuse is another type of one-time programmable interconnect that is equally applicable in the context of the present invention. An antifuse provides a normally open circuit that is short circuited when fused. Thus, both the fuse and antifuse are structures having two ends connected by a programmable link that, on application of suitable laser or electrical programming results in either an open or short circuit, respectively.

Wherever embodiments have been described herein as using fuses, such as in FIGS. 2–10, other embodiments utilizing antifuses are also contemplated. In that case, programming is typically opposite of the fuse embodiments as is readily apparent to those of skill in the art. One advantage of using antifuses in the context of the present invention is that the extra Vcc pin that may be required in, e.g., FIGS. 3A–3C to avoid Vcc being shorted to Vss during test, may be eliminated.

Figure 11:
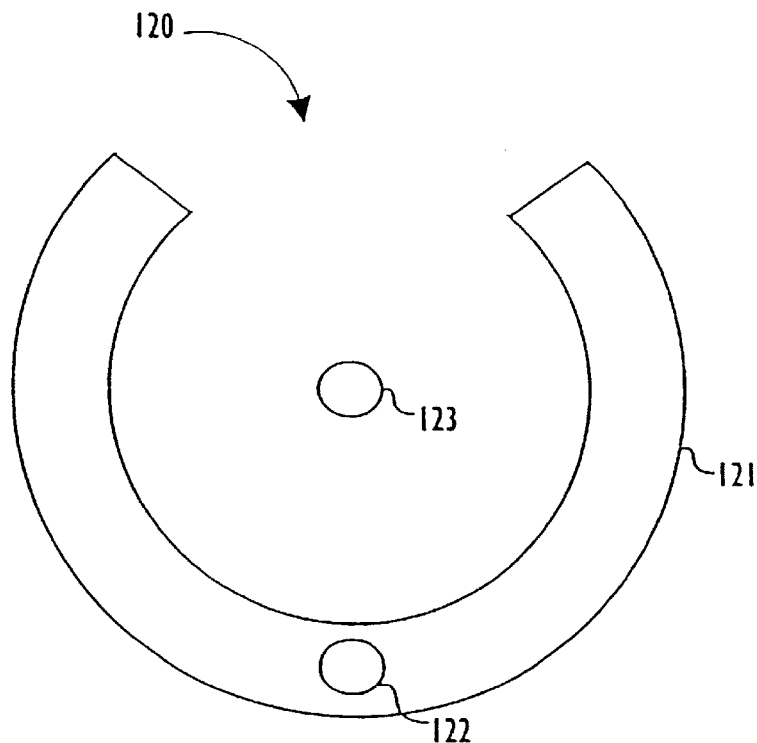
FIG. 11 shows one embodiment of an antifuse structure.

In one embodiment, an antifuse such as the one illustrated in FIG. 11 may be utilized. The antifuse 120 includes a generally circular conductive area 121 which is in electrical contact with via 122. Via 122 may couple, e.g., to a power supply node. Via 123 is not in electrical contact with via 123. If it is desired to short via 122 and 123 together, then conductive paste or solder may be deposited so as to form an electrical contact between via 123 and via 122 and circular conductive area 121. The conductive paste may then be subject to ultraviolet curing.

Figure 12:
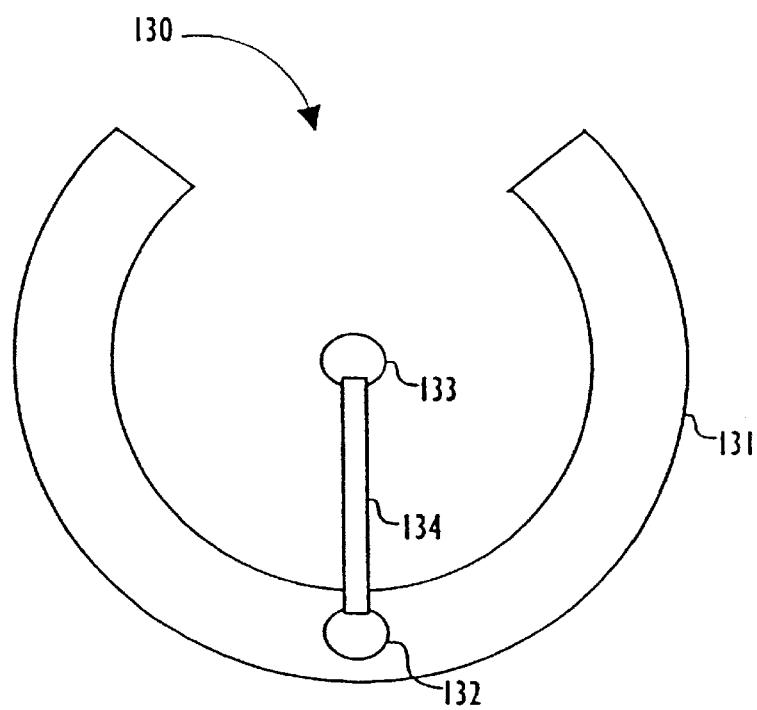
FIG. 12 shows an antifuse in parallel with a fuse.

In another embodiment, an antifuse is combined in parallel with a fuse to provide the capability of reversing a fuse cut. Referring to FIG. 12, antifuse 130 including circular conductive area 131 in electrical contact with via 132. In this embodiment, via 132 is electrically connected to via 133 via fuse 134. If fuse 134 is blown, that can be reversed at a later time by programming antifuse 130, i.e. shorting vias 133 and 132 using solder as described above. Other antifuse approaches may also be used.

While the embodiments have generally been described with relation to a package containing a single integrated circuit and particularly a microprocessor, multi-chip modules may advantageously exploit one or more of the various embodiments described herein. In addition, the invention is not restricted to microprocessors. Other types of integrated circuits may also utilize one or more of the various embodiments described herein.

One advantage of the present invention is that the testing procedures to characterize the part may be completed prior to programming of the fuses. Thus, the part in question may complete tests on automatic test equipment (ATE) as well as system level tests. Once the tests are completed and the part is characterized in terms of voltage and speed, the package may be programmed without having to perform any further processing steps on the die or any further testing, except to check that the fuses were appropriately programmed. Of course, the fuses may be programmed prior to mounting the die if the values for the fuses are known.

The present invention provides method and apparatus that allow a package to be readily programmed by an intended programmer, yet makes programming by unauthorized personnel more difficult. This is accomplished by providing one-time programmable fuses in locations on the package that make re-working difficult, requiring sophisticated equipment. Further, the positioning of the programmable elements renders these elements less conspicuous, thereby lessening the likelihood of tampering with the intended programming.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. A package for mounting at least one integrated circuit die, the package comprising:
 a package substrate, the substrate including:
  a bottom surface having first connectors configured for electrically connecting the package to a circuit board;
  a top surface opposite the bottom surface and having second connectors configured for electrically connecting a semiconductor device to the package substrate;
  at least one one-time programmable element positioned on a surface other than the top surface and having a first and a second end separated by a programmable link, wherein the first end of the at least one one-time programmable element is coupled to a power supply voltage node in the package; and
  side surfaces normal to the top and bottom surfaces, wherein
  the at least one one-time programmable element is positioned on a side of the package substrate.

2. The package as recited in claim 1, wherein a metallization pattern is located on a same side surface of the package substrate.

3. The package as recited in claim 1, wherein the at least one one-time programmable element is laser programmable.

4. The package as recited in claim 1, wherein the at least one one-time programmable element is electrically programmable.

5. The package as recited in claim 1, wherein the at least one one-time programmable element is positioned on at least two side surfaces of the package substrate.

6. The package as recited in claim 1, wherein the at least one one-time programmable element is positioned on the bottom surface of the package substrate.

7. The package as recited in claim 1, wherein the at least one one-time programmable element is positioned within a connector field on the bottom surface of the package substrate.

8. The package of claim 1, wherein there are a plurality of one one-time programmable elements including inactive one-time programmable elements and active one-time programmable elements.

9. A package for mounting at least one integrated circuit die, the package comprising:
 package substrate, the substrate including:
  a bottom surface having first connectors configured for electrically connecting the package to a circuit board;
  a top surface opposite the bottom surface and having second connectors configured for electrically connecting a semiconductor device to the package substrate; and
  at least one one-time programmable element positioned on a surface other than the top surface and having a first and a second end separated by a programmable link, wherein
  the first end of the at least one one-time programmable element is coupled to a power supply voltage node in the package; and
  the at least one one-time programmable element, when programmed, specifies a control value relating to clock frequency at which a processor operates.

10. The method of configuring a circuit board and package arrangement, comprising the steps of:
 electrically and mechanically connecting an integrated circuit to a top surface of the package arrangement, the integrated circuit being configured to operate within specified operating parameters and;
 programming programmable elements positioned on surfaces of the package arrangement, other than a top surface of the package arrangement, to adapt the package arrangement to the specified operating parameters of the integrated circuit, wherein
 at least one programmable element is positioned on a side surface of the package arrangement.

11. The method as recited in claim 10, wherein the top surface of the package arrangement includes circuit board connectors,
 the method further comprising the step of connecting the integrated circuit to the package arrangement through the circuit board connectors.

12. The method as recited in claim 10, wherein the programming includes laser programming the programmable elements.

13. The method as recited in claim 10, wherein the programming includes electrically programming the programmable elements.

14. The method as recited in claim 10, wherein another programmable element is positioned on a bottom surface of the package arrangement.

15. The method as recited in claim 14, wherein the programming includes laser programming the programmable elements.

16. The method as recited in claim 14, wherein the programming includes electrically programming the programmable elements.

17. The method as recited in claim 10, wherein different operating parameters of the integrated circuit are programmed by different respective programmable elements.

18. The method as recited in claim 17, wherein at least one of the operating parameters is programmed by plurality of the programmable elements.

* * * * *